United States Patent
Partovi et al.

(10) Patent No.: US 6,278,308 B1
(45) Date of Patent: *Aug. 21, 2001

(54) LOW-POWER FLIP-FLOP CIRCUIT EMPLOYING AN ASYMMETRIC DIFFERENTIAL STAGE

(75) Inventors: Hamid Partovi; Michael Golden; John Yong, all of Sunnyvale, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/415,760

(22) Filed: Oct. 8, 1999

(51) Int. Cl.[7] .............................. H03K 3/12; H03K 3/037; H03K 3/286; H03K 3/356
(52) U.S. Cl. ............................. 327/218; 327/200; 327/210
(58) Field of Search .................................... 327/200, 201, 327/208, 209, 210, 211, 212, 213, 214, 218, 55, 57; 326/95, 96, 97, 98

(56) References Cited

U.S. PATENT DOCUMENTS

| | | | |
|---|---|---|---|
| 5,712,826 | * | 1/1998 | Wong et al. ........................ 365/226 |
| 5,764,089 | * | 6/1998 | Partovi et al. ...................... 327/200 |
| 5,917,355 | * | 6/1999 | Klass .................................. 327/208 |
| 5,933,038 | * | 8/1999 | Klass .................................. 327/208 |

OTHER PUBLICATIONS

Montanaro, et al., "A 160–MHz, 32–b, 0.5–W CMOS RISC Microprocessor", IEEE Journal of Solid–State–Circuits, vol. 31, No. 11, No. 1996.

* cited by examiner

Primary Examiner—Terry D. Cunningham
Assistant Examiner—Anh-Quan Tra
(74) Attorney, Agent, or Firm—Conley, Rose & Tayon, PC; B. Noël Kivlin

(57) ABSTRACT

A flip-flop circuit includes a differential stage coupled to a transparent latch. Respective sides of the differential stage, referred to as the "output side" and the "reference side," are precharged high during a precharge phase. During an evaluation phase, the state of a data input signal is sensed. Depending upon the state of the data input signal, either the output side or the reference side is discharged. Also, during the evaluation phase, the transparent latch is enabled, and thereby samples and stores an output signal from the output side of the differential stage. Upon initiation of the next precharge phase, the transparent latch is quickly disabled (i.e., is placed in an opaque state), and retains its present state. Since only a single side of the differential stage is used to drive the transparent latch, the differential stage may advantageously be implemented in an asymmetric fashion. In yet an additional embodiment, complex logic may be added to the differential stage of the flip-flop circuit.

21 Claims, 4 Drawing Sheets

LOW-POWER FLIP-FLOP CIRCUIT EMPLOYING AN ASYMMETRIC DIFFERENTIAL STAGE

BACKGROUND OF THE INVENTION

1. Field of the Invention

This invention relates to flip-flop circuits and, more particularly, to flip-flop circuits having low power consumption, low latency, and low hold-time characteristics.

2. Description of the Related Art

Almost all modern microprocessors use a technique called pipelining to increase throughput. Pipelining involves partitioning a process with "n" steps into "n" hardware stages, each separated by memory elements called registers which hold intermediate results. These registers are typically implemented using flip-flop circuits. There is one pipeline stage for each step in the process. By allowing each of the "n" stages to operate concurrently, the pipelined process could theoretically operate at nearly "n" times the rate of the non-pipelined process.

The benefits of pipelining in a microprocessor may be diminished if the latencies associated with the inter-stage registers consume a sizable percentage of the period of the microprocessor's internal clock. The latency $t_{DQ}$ of a flip-flop circuit may be generally defined as $t_{SU}+t_{CQ}$, where $t_{SU}$ is the setup time and $t_{CQ}$ is the clock-to-valid output time. With ever-increasing clock frequencies, it is becoming increasingly important to implement inter-stage registers of microprocessors using flip-flop circuits with very low latencies.

Another important characteristic associated with the flip-flop circuits which form inter-stage registers in microprocessors is hold-time. The hold-time of a flip-flop circuit is defined as the minimum time the data input signal must be valid following a sampling clock edge. Violations in the hold-time of a flip-flop circuit may result in race conditions. Like latency, it is desirable to reduce the required hold-time characteristics of flip-flop circuits which are used to implement inter-state registers in microprocessors.

Several additional considerations may also be important in the designs of flip-flop circuits used in microprocessors. For example, it is often important to utilize flip-flop circuits which are associated with low-power consumption characteristics. Low-power consumption is particularly important for microprocessors utilized in mobile applications, such as in lap-top computers.

In addition, it is often desirable to embed logic functionality within the input section of a flip-flop circuit. However, in a typical flip-flop circuit, the addition of logic functionality at the input section creates difficulties since the symmetry in the flip-flop's differential input amplifier section may be lost. For example, a four-input NOR gating function provided on one side of the differential amplifier typically requires that a matching four-input NAND gating function be provided on the opposite side of the differential amplifier.

FIG. 1 is a schematic diagram illustrating a typical prior art flip-flop circuit. The flip-flop circuit of FIG. 1 includes a differential stage 10 coupled to a pair of cross-coupled NAND gates 12. The cross-coupled NAND gates 12 form an S-R latch. During operation, lines 14 and 16 of respective sides of differential stage 10 are precharged high when the clock signal CLK is low. When the clock signal CLK goes high, transistor 18 turns on, as well as one of transistors 20 or 22, depending upon the state of input signals INL and INH (which are differential in nature). This correspondingly causes one of lines 14 or 16 to be discharged low to Vss. One of the output lines OUTL or OUTH of the flip-flop circuit is accordingly driven to a high state, and the other output is driven to a low state. These values are held through the precharge phase of a subsequent clock cycle, and may be altered in accordance with a change in the input signal during a subsequent evaluation phase. It is noted that transitions from low to high in output signal OUTL (and corresponding transitions from high to low in output signal OUTH) are caused by discharging line 14 of differential stage 10, while transitions from low to high in output signal OUTH (and corresponding transitions from high to low in output signal OUTL) are caused by discharging line 16 of differential stage 10.

Implementations of the flip-flop circuit of FIG. 1 may be associated with relatively high latency and hold-time characteristics, as well as relatively high power consumption characteristics. This is due in part to the fact that both sides of the differential stage are used to control the state of the cross-coupled NAND gates 12, thus requiring that the transistors forming each side of differential stage 10 be of sufficient size to drive cross-coupled NAND gates 12.

It would be desirable to provide a flip-flop circuit which is associated with low power consumption, low latency, and low hold time characteristics. Additionally, it would be desirable to provide a flip-flop circuit which readily accommodates complex input logic.

SUMMARY OF THE INVENTION

The problems outlined above are in large part solved by a flip-flop circuit in accordance the present invention. In one embodiment, a flip-flop circuit includes a differential stage coupled to a transparent latch. Respective sides of the differential stage, referred to as the "output side" and the "reference side," are precharged high during a precharge phase. During an evaluation phase, the state of a data input signal is sensed. Depending upon the state of the data input signal, either the output side or the reference side is discharged. Also, during the evaluation phase, the transparent latch is enabled, and thereby samples and stores an output signal from the output side of the differential stage. Upon initiation of the next precharge phase, the transparent latch is quickly disabled (i.e., is placed in an opaque state), and retains its present state.

Since only a single side of the differential stage is used to drive the transparent latch, the differential stage may advantageously be implemented in an asymmetric fashion. More particularly, transistors forming the reference side of the differential stage may be fabricated using smaller channel widths than corresponding transistors forming the output side of the differential stage. This advantageously allows high speed implementation s of the flip-flop circuit while reducing latency, hold-time, and power consumption.

The flip-flop circuit may include a clock conditioning circuit which receives an input clock and generates a corresponding differential clock signal for controlling occurrences of the precharge and evaluation phases of the differential stage. The clock conditioning circuit further generates a latch clock signal which selectively enables the transparent latch. In one embodiment, the clock conditioning circuit is configured to generate the latch clock signal such that it quickly disables the transparent latch at the start of a precharge phase of the differential stage. A transition in the latch clock signal which causes the transparent latch to be enabled is, however, delayed somewhat with respect to the differential stage clock signal such that the latch is held in an opaque state until the differential stage resolves according to the data input signal. This may advantageously prevent unwanted "glitches" in the output of the flip-flop circuit.

In yet an additional embodiment, complex logic may be added to the differential stage of the flip-flop circuit. Due to the asymmetric nature of the transistors forming the differential stage, the complex logic generates a gating signal to control only the output side of the differential stage. The reference side of the differential stage is gated by a clock signal (e.g., the differential stage clock signal). This thereby eliminates the need for matching logic to generate a corresponding gating signal to control the reference side of the differential stage.

BRIEF DESCRIPTION OF THE DRAWINGS

Other objects and advantages of the invention will become apparent upon reading the following detailed description and upon reference to the accompanying drawings in which.

Figure 1:
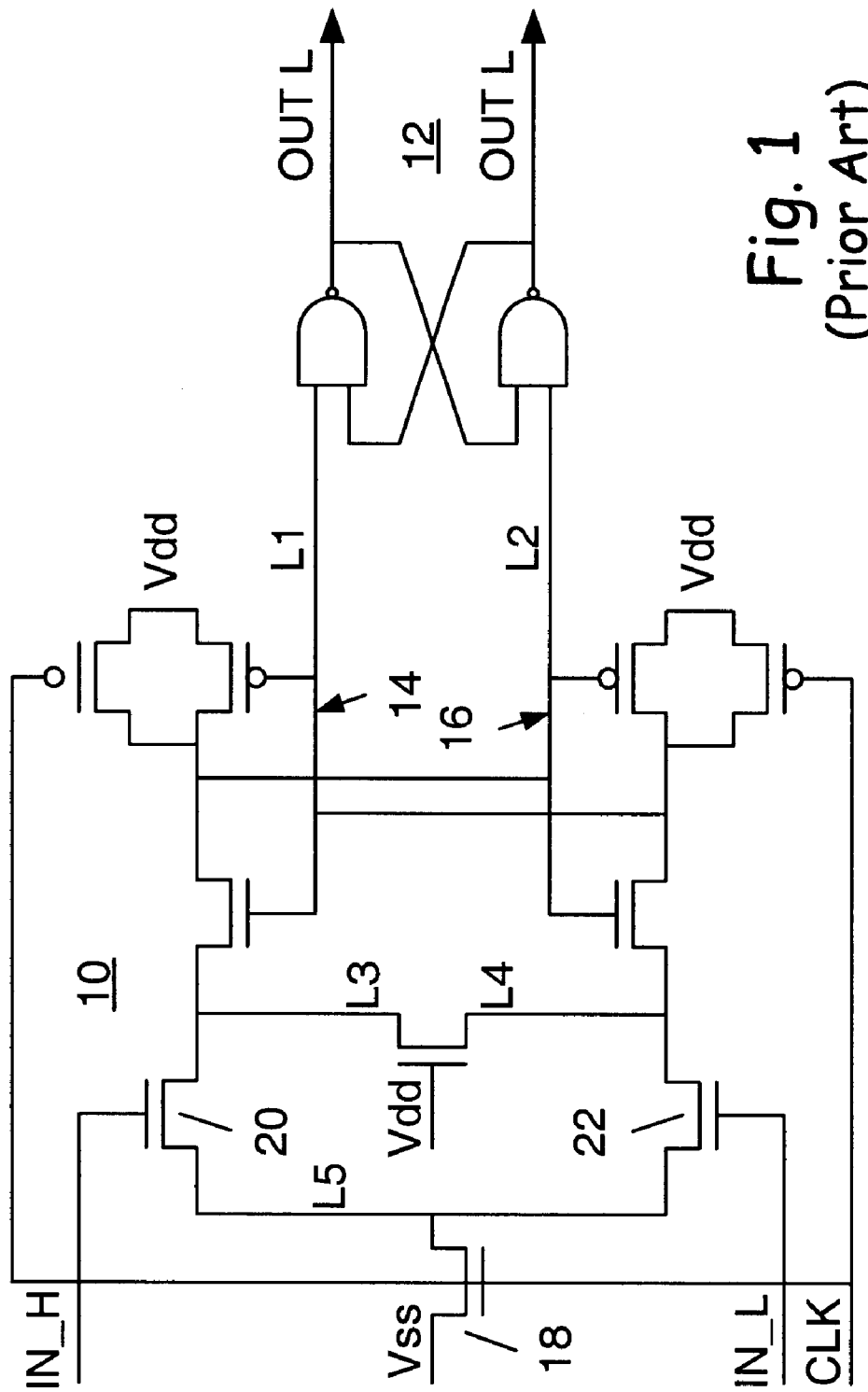
FIG. 1 (prior art) is a schematic diagram illustrating a typical flip-flop circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 2:
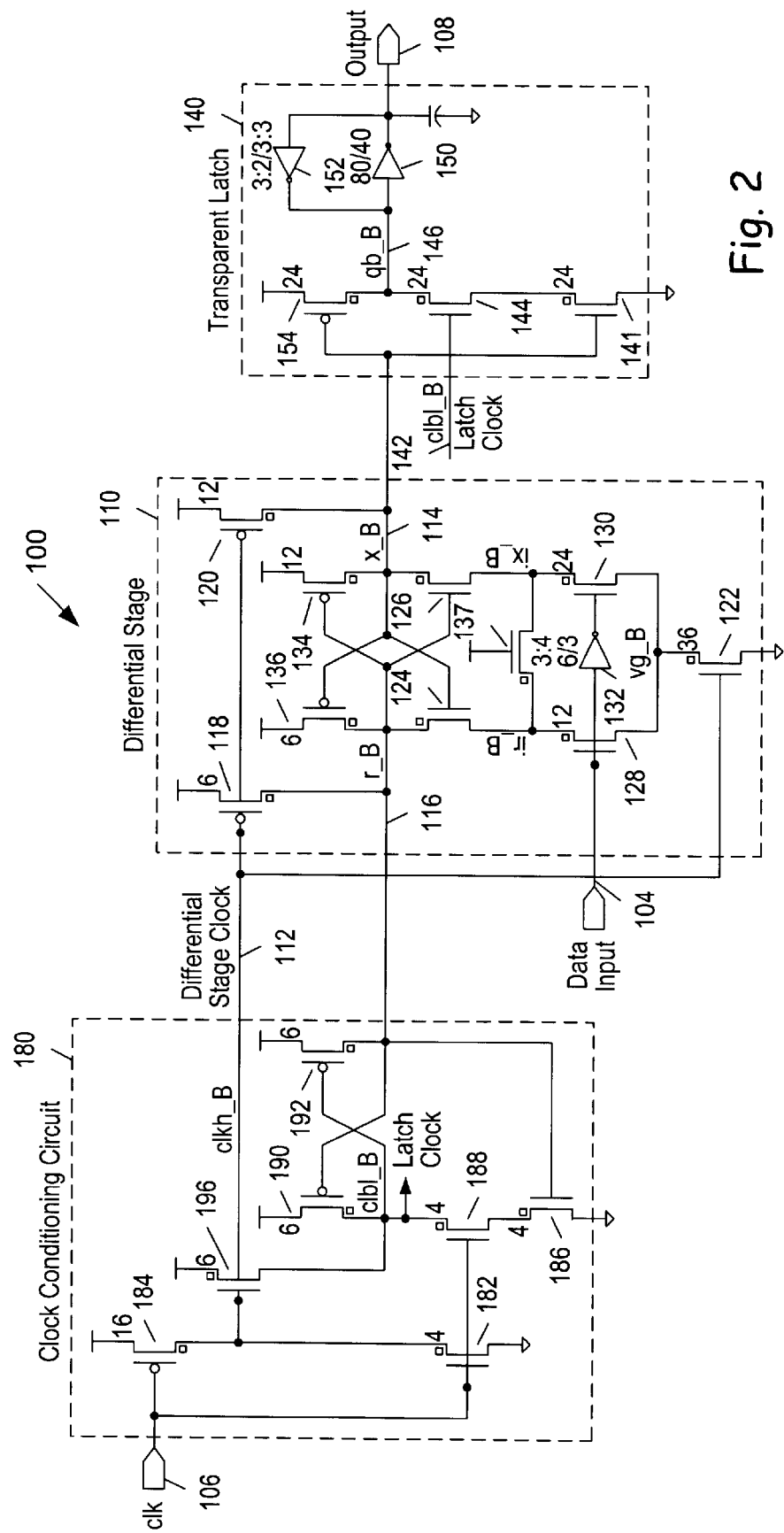
FIG. 2 is a schematic diagram illustrating one embodiment of a flip-flop circuit.

Turning next to FIG. 2, a schematic diagram illustrating one embodiment of a flip-flop circuit 100 in accordance with the present invention is shown. The flip-flop circuit 100 of FIG. 2 includes a differential stage 110 coupled to a transparent latch 140. In this embodiment, the flip-flop circuit 100 receives a data input signal at an input line 104 of differential stage 110, and generates a data output signal at an output line 108 of transparent latch 140. Flip-flop circuit 100 further includes a clock conditioning circuit 180 which receives an input clock signal CLK at line 106. Clock conditioning circuit 180 generates a differential stage clock signal which is provided to differential stage 110 at a line 112, and generates a latch clock signal which is provided to transparent latch 140 at line 142.

Differential stage 110 includes an output side at line 114 and a reference side at line 116. The reference side of differential stage 110 is associated with transistors 124, 128, and 136, and the output side of differential stage 110 is associated with transistors 126, 130, and 134.

During a precharge phase of the operation of flip-flop circuit 100, which is initiated when the differential stage clock signal is low, p-channel transistors 118 and 120 turn on, thus precharging lines 114 and 116. It is noted that the differential stage clock signal at line 112 is an inverted version of the input clock signal CLK provided at line 106. That is, when the input clock signal CLK at line 106 goes high, n-channel transistor 182 turns on and p-channel transistor 184 turns off. This correspondingly drives the differential stage clock signal at line 112 low. When clock signal CLK at line 106 goes low, transistor 182 turns off and transistor 184 turns on, thus driving the differential stage clock signal high. The precharge phase of flip-flop circuit 100 completes when the differential stage clock signal goes high, thus turning off transistors 118 and 120.

At the start of the precharge phase when the differential clock signal goes low, it is important that the storage state of transparent latch 140 is not affected (i.e., is not altered) due to the precharge of line 114. For this reason, the latch clock signal provided at line 142 by clock conditioning circuit 180 is driven low very quickly after the input clock signal CLK goes high. This is achieved since, if prior to its precharge, line 114 is low (and thus line 116 is high), the voltage at the gate of n-channel transistor 186 is sufficient to bias the transistor on. Since transistor 188 turns on in direct response to the input clock signal CLK going high, the latch clock signal is quickly driven low. When the latch clock signal goes low, transistor 144 is biased off which prevents the precharge of line 114 from changing the stored state of transparent latch 140 at line 146 from high-to-low.

An evaluation phase of flip-flop circuit 100 begins when the differential stage clock signal goes high. At this point, n-channel transistor 122 of differential stage 110 turns on. Since both lines 114 and 116 have initially been precharged high, the voltage levels at the gates of n-channel transistors 124 and 126 of differential stage 100 will be sufficient to bias either of them on. If the data input signal at line 104 is high at the start of the evaluation phase, n-channel transistor 128 turns on and n-channel transistor 130 turns off (in accordance with inverter 132). Since transistors 122, 124 and 128 are all turned on at this point, line 116 will discharge low. As line 116 discharges low, transistor 126 will be biased off, and p-channel transistor 134 will turn on, thus forcing line 114 to a high state. This also causes transistor 124 to be forced into an on state and p-channel transistor 136 to be forced into an off state. The differential stage 110 is thus strongly held in this state (with line 116 discharged) until a subsequent precharge phase (when the differential stage clock signal returns low). It is noted that a transistor 137 may be provided within differential stage 110 to provide a dc path to ground for leakage currents on lines 114 and 116 in case the data input signal to the differential stage 110 switches after the stage evaluates.

A similar action occurs if the data input signal at line 104 is low at the start of an evaluation phase, but results in line 114 being discharged. More particularly, if the data input signal at line 104 is low at the start of an evaluation phase, transistor 128 is biased off and transistor 130 is biased on. This accordingly causes the differential stage output signal at line 114 to be discharged low.

The clock conditioning circuit 180 drives the latch clock signal during the evaluation phase such that the output of differential stage 110 at line 114 is sampled by transparent latch 140. In the depicted embodiment, at the beginning of the evaluation phase when the differential stage clock signal goes high, n-channel transistor 196 of clock conditioning circuit 180 is biased on. This causes the latch clock signal provided to line 142 to be driven high at a relatively slow rate in comparison to the rate at which line 114 of differential stage 110 may be discharged. Additionally, if the reference side of differential stage 110 at line 116 is discharged, n-channel transistor 186 turns off, and p-channel transistor 190 turns on. This forces the latch clock input signal in its high state until the next precharge phase.

Therefore, when the latch clock signal provided to transparent latch 140 goes high during the evaluation phase, line 146 is driven low if line 114 is high (i.e., was not discharged). Alternatively, line 146 is driven high if line 114 is low (i.e., was discharged). At the start of the next precharge phase, the latch clock signal is quickly driven low, thus biasing transistor 144 off, and lines 114 and 116 of differential stage 110 are precharged.

Inverter 150 and inverter 152 (a "trickle" inverter) of transparent latch 140 collectively form a keeper circuit which retains the state at line 146 (and a corresponding inverted state at line 108) during the precharge phase. Thus, if line 146 is driven low in response to transistors 141 and 144 being turned on during a given evaluation phase, the keeper circuit formed by inverters 150 and 152 retains a low state at line 146 throughout the subsequent precharge phase (after transistors 141 and 144 are turned off). The output signal of flip-flop circuit 100 is thus driven high On the other hand, if line 114 is driven low during a given evaluation phase, p-channel transistor 154 of transparent latch 140 turns on, thus driving line 146 high. The output signal of flip-flop circuit 100 is thus driven low. This state is similarly stored by the keeper circuit formed by inverters 150 and 152 throughout the subsequent precharge phase (after transistor 154 is biased off).

It is noted that since only a single side (i.e., at line 114) of differential stage 110 is utilized to drive the next state of transparent latch 140, the transistors forming each side of differential stage 110 may be asymmetrically sized. For example, in the depicted embodiment, the channel widths of transistors 126, 130, and 134 are twice those of corresponding transistors 124, 128, and 136. Transistors 126 and 130 are sufficiently sized to quickly discharge line 114 during an evaluation phase, thus accommodating high speed, while waste of energy is reduced due to the relatively small transistors associated with the reference side of differential stage 110.

It is further noted that since the latch clock signal provided to line 142 is driven high at a relatively slow rate (or is delayed) at the start of the evaluation phase of differential stage 110, "glitches" in the output signal may be prevented.

Figure 3:
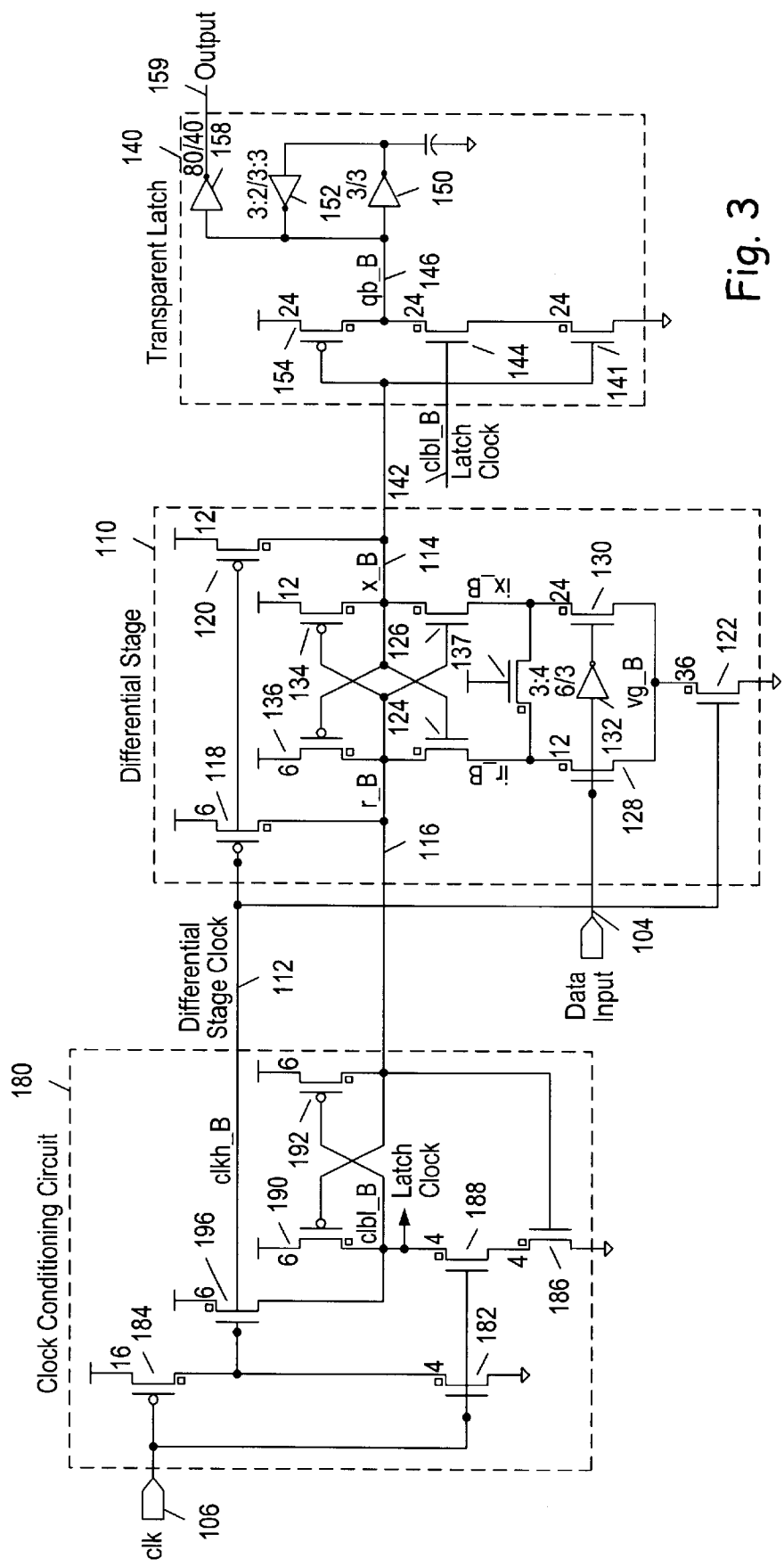
FIG. 3 is a schematic diagram illustrating another embodiment of a flip-flop circuit.

FIG. 3 is a schematic diagram illustrating another embodiment of a flip-flop circuit. Circuit portions which correspond to those of FIG. 2 are numbered identically for simplicity and clarity.

The flip-flop circuit of FIG. 3 is similar to that of FIG. 2; however, an additional inverter 158 is provided within transparent latch 140 to drive the output of the flip-flop circuit at line 159. In this embodiment, the transistors forming inverter 158 are relatively large compared to the transistors forming inverters 150 and 152 associated with the keeper circuit. The embodiment of FIG. 3 may advantageously provide improved isolation of the memory node 146 from the output of the flip-flop circuit at line 159. Accordingly, the flip-flop circuit may be more tolerant of noise at output 159 to thereby avoid a data loss.

Figure 4:
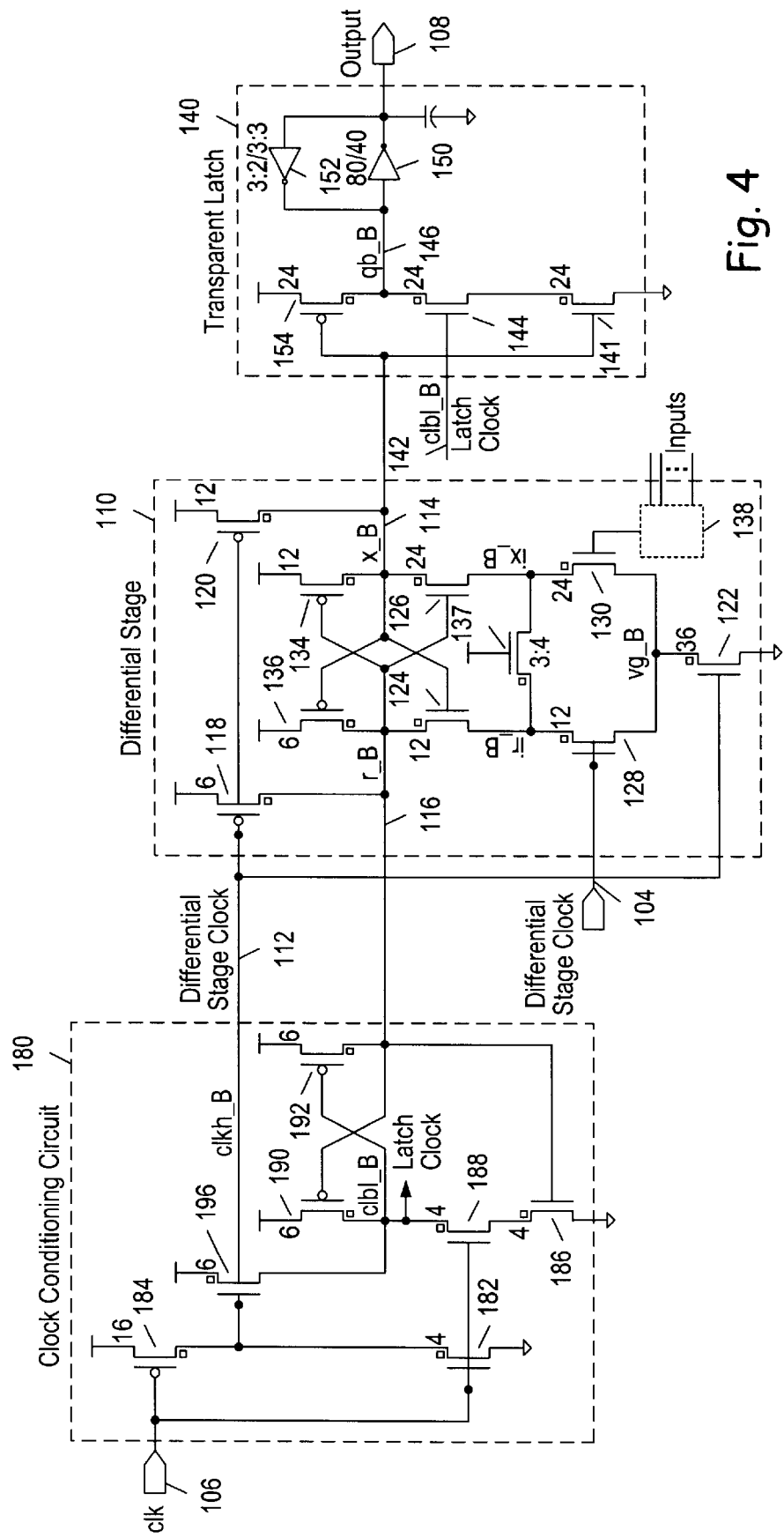
FIG. 4 is a schematic diagram illustrating another embodiment of a flip-flop circuit which accommodates complex input logic.

Turning finally to FIG. 4, a schematic diagram of yet another embodiment of the flip-flop circuit is shown. Again, circuit portions which correspond to those of FIG. 2 are numbered identically for simplicity and clarity.

The flip-flop circuit of FIG. 4 is similar to that of FIG. 2; however, in FIG. 4 differential stage 110 includes a logic circuit 138 coupled to receive a plurality of inputs and coupled to provide an output to the gate of transistor 130.

The gate of transistor 128 is coupled to receive the differential stage clock signal rather than a data input signal. The logic circuit 138 may be any logic circuit having a predefined logic function, such as a four-input NOR gate. During the evaluation phase of operation of the flip-flop circuit of FIG. 4, depending upon the inputs to logic circuit 138, the output of the logic circuit 138 will resolve to either high or low, thus either turning on or off transistor 130. Although during the evaluation phase transistor 128 is also biased on due to the phase of the differential stage clock signal, since transistors 126 and 130 are larger than corresponding transistors 124 and 128, if transistor 130 is turned on, line 114 will discharge quickly, thus biasing off transistor 124 and biasing on transistor 136. The differential stage will thus resolve such that line 114 is discharged and line 116 remains high. On the other hand, if transistor 130 is not turned on (due to the output of logic circuit 138 resolving to a low state), transistors 128 and 124 will turn on, thus discharging line 116, in a manner as discussed previously. The flip-flop circuit of FIG. 4 advantageously accommodates the addition of complex input logic without requiring that matched logic be provided on both sides of the differential stage 110.

While the present invention has been described with reference to particular embodiments, it will be understood that the embodiments are illustrative and that the invention scope is not so limited. Any variations, modifications, additions and improvements to the embodiments described are possible. These variations, modifications, additions and improvements may fall within the scope of the invention as detailed within the following claims.

What is claimed is:

1. A flip-flop circuit comprising:
   a data input line for receiving a data input signal;
   a clock line for receiving a clock signal;
   a differential stage having an output side and a reference side, wherein said differential stage is configured to generate a differential stage output signal on said output side indicative of a state of said data input signal during an evaluation phase of said clock signal; and
   a transparent latch for retaining a stored state, said transparent latch having a first input coupled to said output side of said differential stage and a second input coupled to receive a delayed version of said clock signal, wherein transitions in said stored state occur dependent upon the delayed version of said clock signal and said differential stage output signal.

2. The flip-flop circuit as recited in claim 1 wherein said transparent latch includes a logic circuit and a keeper circuit, wherein said logic circuit is coupled to receive said differential stage output signal and is configured to selectively provide a signal dependent upon said differential stage output signal to said keeper circuit.

3. The flip-flop circuit as recited in claim 2 wherein said logic circuit includes a p-channel transistor having a source coupled to a reference power supply, a gate coupled to receive said differential stage output signal, and a drain coupled to an input of said keeper circuit.

4. The flip-flop circuit as recited in claim 3 wherein said logic circuit further includes a first n-channel transistor having a source coupled to a ground reference and a gate coupled to receive said differential stage output signal, and wherein said logic circuit further includes a second n-channel transistor having a source coupled to a drain of said first n-channel transistor, a drain coupled to said input of said keeper circuit, and a gate coupled to receive the delayed version of said clock signal.

5. The flip-flop circuit as recited in claim 1 wherein said differential stage includes a first set of transistors for driving said differential stage output signal and a second set of transistors for driving a reference signal upon said reference side, wherein said first set of transistors is asymmetrically sized respect to said second set of transistors.

6. The flip-flop circuit as recited in claim 5 wherein each transistor of said first set is larger than a corresponding transistor of said second set.

7. The flip-flop circuit as recited in claim 4 wherein said differential stage is configured to drive said reference signal on said reference side differentially with respect to said differential stage output signal on said output side during said evaluation phase.

8. The flip-flop circuit as recited in claim 6 wherein said differential stage is configured to precharge said reference side and said output side during a precharge phase of said clock signal.

9. A flip-flop circuit comprising:
   a differential stage having an output side and a reference side, wherein said differential stage is coupled to receive a differential stage clock signal and a data input signal, and wherein said differential stage is configured to generate a differential stage output signal on said output side indicative of a state of said data input signal during an evaluation phase of said differential stage clock signal; and
   a transparent latch for retaining a stored state, wherein said transparent latch is coupled to receive said differential stage output signal and a delayed version of said differential stage clock signal, and wherein the transparent latch is selectively enabled by the delayed version of said differential stage clock signal, and wherein transitions in said stored state occur when the transparent latch is enabled and are dependent upon said differential stage output signal.

10. The flip-flop circuit as recited in claim 9, wherein said differential stage comprises dynamic logic, and wherein the output side of said differential stage comprises an output line, and where said differential stage output signal is present upon said output line during the evaluation phase of said differential stage clock signal, and wherein said transparent latch is coupled to receive said differential stage output signal from said output line, and wherein said output line is precharged during a precharge phase of said differential stage clock signal.

11. The flip-flop circuit as recited in claim 10, wherein said transparent latch is disabled by the delayed version of said differential stage clock signal during the precharge phase of said differential stage clock signal.

12. The flip-flop circuit as recited in claim 11, wherein said transparent latch is enabled by the delayed version of said differential stage clock signal during the evaluation phase of said differential stage clock signal, and wherein a transition of the delayed version of said differential stage clock signal which enables said transparent latch is delayed with respect to a corresponding transition of said differential stage clock signal.

13. The flip-flop circuit as recited in claim 10, wherein said differential stage comprises a first set of transistors for selectively forming a current path between the output line and a ground reference potential dependent upon the state of said data input signal.

14. The flip-flop circuit as recited in claim 13, wherein said reference side comprises a reference line, and wherein said reference line is precharged during the precharge phase of said differential stage clock signal.

15. The flip-flop circuit as recited in claim 14, wherein said differential stage comprises a second set of transistors for selectively forming a current path between the reference line and the ground reference potential dependent upon the state of said data input signal.

16. The flip-flop circuit as recited in claim 15, wherein each of the first set of transistors corresponds to a different one of the second set of transistors, and wherein at least one of the first set of transistors has a channel width which is greater than a channel width of the corresponding one of the second set of transistors.

17. The flip-flop circuit as recited in claim 9, further comprising a clock conditioning circuit coupled to receive a clock signal and configured to produce said differential stage clock signal and the delayed version of said differential stage clock signal.

18. The flip-flop circuit as recited in claim 10, wherein said differential stage comprises:
   a logic circuit coupled to receive a plurality of input signals and configured to produce an output signal; and
   a first set of transistors for selectively forming a current path between the output line and a ground reference potential dependent upon a state of the output signal produced by said logic circuit.

19. The flip-flop circuit as recited in claim 18, wherein said reference side comprises a reference line, and wherein said reference line is precharged during the precharge phase of said clock signal.

20. The flip-flop circuit as recited in claim 19, wherein said differential stage comprises a second set of transistors for selectively forming a current path between the reference line and the ground reference potential dependent upon said differential stage clock signal.

21. The flip-flop circuit as recited in claim 20, wherein each of the first set of transistors corresponds to a different one of the second set of transistors, and wherein at least one of the first set of transistors has a channel width which is greater than a channel width of the corresponding one of the second set of transistors.

* * * * *